United States Patent [19]
Yoshida et al.

[11] Patent Number: 5,501,350
[45] Date of Patent: Mar. 26, 1996

[54] PROCESS FOR PRODUCING PRINTED WIRING BOARD

[75] Inventors: Risaburo Yoshida; Kiyotomo Nakamura; Akitsu Ota; Mitsuaki Taguchi, all of Tokyo, Japan

[73] Assignee: Toppan Printing Co., Ltd., Tokyo, Japan

[21] Appl. No.: 369,087

[22] Filed: Jan. 5, 1995

[30] Foreign Application Priority Data

| | | | |
|---|---|---|---|
| Jan. 6, 1994 | [JP] | Japan | 6-000239 |
| Sep. 13, 1994 | [JP] | Japan | 6-244744 |
| Nov. 28, 1994 | [JP] | Japan | 6-292544 |

[51] Int. Cl.$^6$ ............ H01B 13/00; B44C 1/22; C23F 1/00
[52] U.S. Cl. ............ 216/20; 216/43; 216/101; 216/106
[58] Field of Search ............ 216/13, 20, 41, 216/43, 49, 56, 101, 105, 106; 29/846, 852

[56] References Cited

U.S. PATENT DOCUMENTS

| | | | |
|---|---|---|---|
| 2,932,599 | 4/1960 | Dahlgren | 216/20 |
| 3,177,103 | 4/1965 | Tally et al. | 216/20 |
| 4,790,902 | 12/1988 | Wada et al. | 216/20 |
| 5,106,454 | 4/1992 | Allardyce et al. | 216/20 |

FOREIGN PATENT DOCUMENTS

| | | |
|---|---|---|
| 2-58898 | 2/1990 | Japan. |
| 3-3297 | 1/1991 | Japan. |
| 3-203390 | 9/1991 | Japan. |
| 3-260077 | 11/1991 | Japan. |
| 4-349466 | 12/1992 | Japan. |
| 6-45729 | 2/1994 | Japan. |

*Primary Examiner*—William Powell
*Attorney, Agent, or Firm*—Armstrong, Westerman, Hattori & Naughton

[57] ABSTRACT

A process for producing a printed wiring board, comprising the steps of forming a photosensitive resist layer on a copper layer provided on an insulating substrate, patterning the photosensitive resist layer, and etching the copper layer made bare from the photosensitive resist layer to form a copper wiring layer, wherein the surface of the copper layer is subjected to pretreatment comprising the steps of black-oxide treating the surface by the use of an alkaline oxidizing solution and subsequently finely surface-roughening the black-oxide treated surface by the use of an acidic treating solution comprised of phosphoric acid or an organic acid, followed by drying in the presence of oxygen, and thereafter the photosensitive resist layer is formed thereon. Such pretreatment enables formation of fine and uniform roughness on the copper layer surface to bring about an improvement in its adhesion to the resist layer, so that etching solutions can be prevented from penetrating the interface between these layers. The drying step causes the copper layer surface to undergo oxidation to decrease reflectance on its surface, so that it is possible to prevent pattern disorder of photosensitive regions during patternwise exposure.

11 Claims, 9 Drawing Sheets

PRIOR ART

PROCESS FOR PRODUCING PRINTED WIRING BOARD

BACKGROUND OF THE INVENTION

1. Field of the Invention

This invention relates to a process for producing a printed wiring board, and more particularly to a process for producing a printed wiring board, that can form fine and highly precise wiring patterns and also can achieve a production cost reduction.

2. Description of the Prior Art

Printed wiring boards commonly comprise an insulating substrate made of glass fiber impregnated with an epoxy resin, and a copper conductive layer comprised of a copper wiring layer, an electrode and through holes, and are grouped into single-sided printed wiring boards, double-sided printed wiring boards, and multi-layer boards (multi-layer printed wiring boards). On these printed wiring boards, there is in recent years an increasing demand for making finer the wiring patterns formed of conductive layers.

Now, a production process hitherto commonly used for printed wiring boards will be described with reference to FIG. 10. A copper foil having been appropriately subjected to surface treatment such as surface roughening, corrosion prevention and thermal color-change prevention is laminated to the whole surface of an insulating substrate in the manner that the former's roughened surface comes in contact with the surface of the latter to obtain a printed wiring board material (a copper-clad laminate). Next, the surface of the copper foil is mechanically polished by buffing or the like and also chemically polished. Thereafter, to the surface thus polished, a photosensitive dry film is laminated to form a photosensitive resist layer. This photosensitive resist layer is patternwise exposed to light in a desired form, followed by development to pattern the photosensitive resist layer, and also the copper foil bared through this resist layer is subjected to wet etching to form a copper foil wiring layer. In such a conventional process, before forming the photosensitive resist layer, the copper foil surface is treated so as to be roughened and freshed to improve its adhesion to the photosensitive resist layer.

Figure 10:
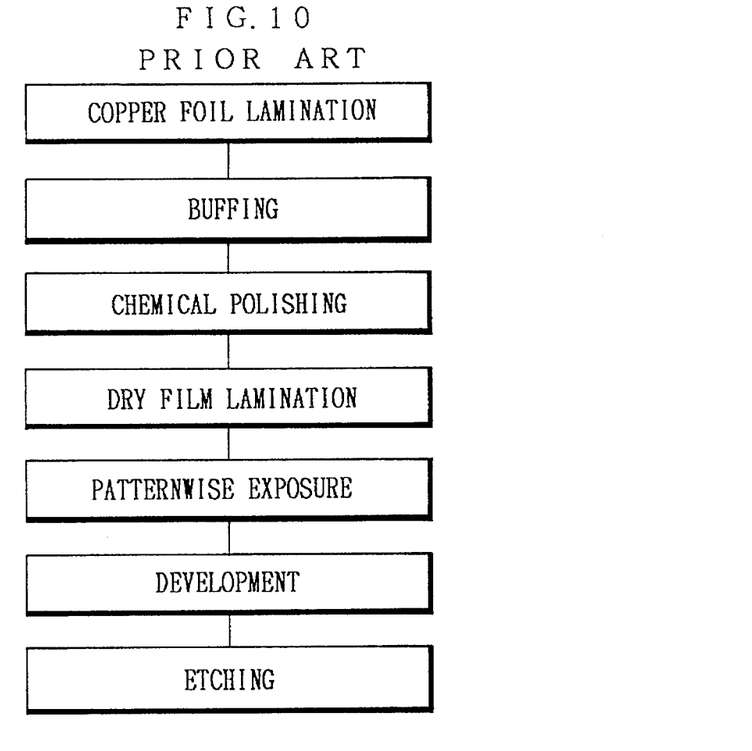
FIG. 10 is a flow chart to illustrate the order of steps in a process for producing a printed wiring board according to the prior art.

In the FIG. 10 flow chart, some steps are omitted, e.g., the step of forming through holes which is a subsequent step required when the printed wiring board is a multi-layer wiring board comprised of a plurality of inner-layer circuit boards, and the step of solder plating.

In this conventional process, however, the adhesion between the photosensitive resist layer and the copper foil surface can not be said to be satisfactory, and the process has the disadvantage that an ethcing solution tends to enter through a gap between the photosensitive resist layer and the copper foil surface to cause form disorder and pattern defects in the copper wiring layer formed after etching. Stated additionally, since the copper foil surface on which the photosensitive resist layer is a polished surface, it provides a light-reflecting plane inherent in metals, and this may also cause pattern form disorder when the photosensitive resist layer is patternwise exposed in a desired form.

Figure 11:
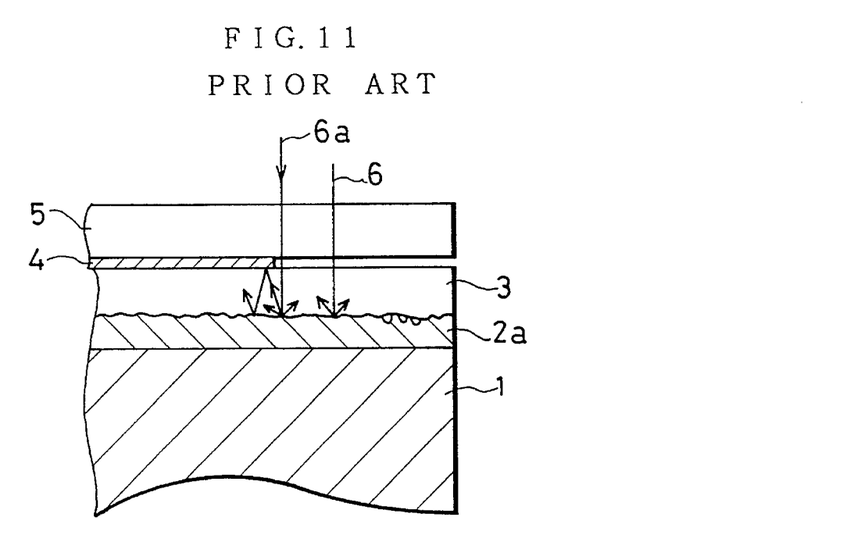
FIG. 11 illustrates how the step of exposure proceeds in the process for producing a printed wiring board according to the prior art.

These points will be explained with reference to FIG. 11. In FIG. 11, a copper layer (copper foil) 2a laminated to the surface of an insulating substrate 1 is a layer afterwards patternwise etched to form a wiring layer. In the step of exposure, the copper layer 2a is entirely covered with a photosensitive dry film (photosensitive resist) 3. This photosensitive dry film 3 is exposed to light through an exposure mask comprising a transparent substrate 5 having a negative type light-screening film 4 with a desired pattern, and thereby the dry film 3 is photo-cured in the desired pattern form. However, as stated above, the surface of the copper layer 2a forms a roughly glossy plane as a result of polishing, and hence, as shown in FIG. 11, incident light 6 reaches the surface of the copper layer 2a and irregularly reflects therefrom. In particular, the light like incident light 6a made incident from the part near to an end of the light-screening film 4 irregularly reflects from the surface of the copper layer 2a to cause disorder of photosensitive pattern form of the dry film 3 and also reflects from the surface of the light-screening film 4 of the exposure mask, where it successively repeats multiple reflection to increasingly cause disorder of the form of photosensitive regions of the dry film 3. This disorder of the form is presumed to be taken over also in development and etching to consequently make it difficult to form highly precise patterns as a wiring layer.

Meanwhile, in addition to such a disadvantage that the wiring layer can not be made into highly precise patterns, there is a problem that a phenomenon called "haloing" as explained below may occur when the multi-layer wiring boards are produced by this conventional process.

Figure 12A:
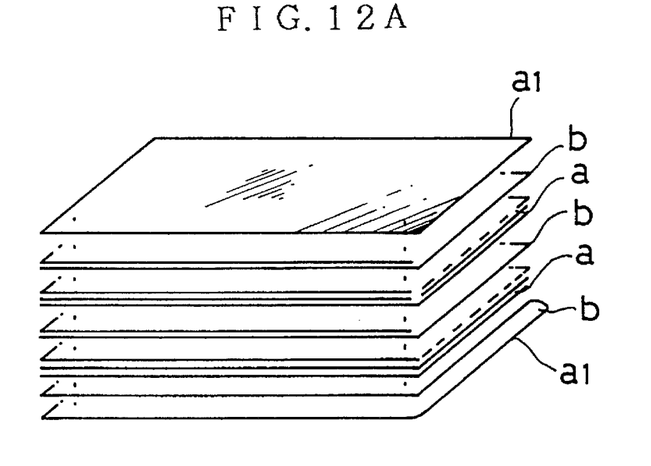
FIGS. 12A to 12G are perspective views to illustrate a process for producing a multi-layer printed wiring board.
Figure 12B:
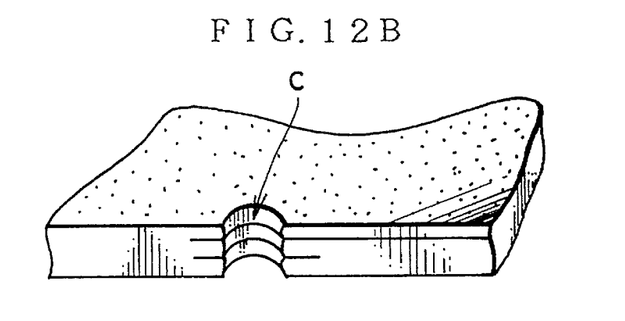
Figure 12C:
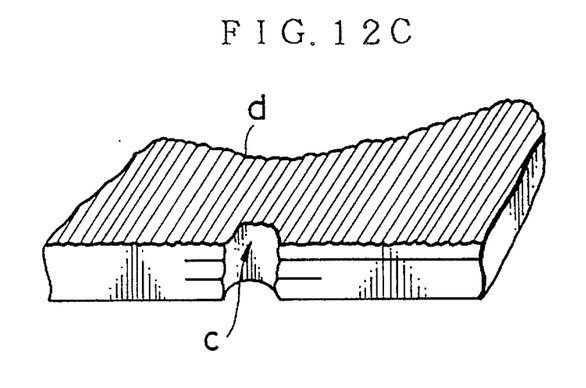

That is, the multi-layer wiring boards of this type are hitherto produced by laminating via adhesive insulating layers (prepregs) a plurality of inner-layer circuit boards each having a patterned wiring layer. A production process thereof will be schematically illustrated below with reference to FIGS. 12A to 12G. As shown in FIG. 12A, a plurality of inner-layer circuit boards a having copper wiring layers are put together layer-by-layer via adhesive insulating layers (prepregs) b together with outer-layer copper foils $a_1$, and then a through hole c as shown in FIG. 12B is provided by a suitable boring means (e.g., drilling). Thereafter, this through hole c is chemically plated with copper in order to cover the inner wall of the through hole with a copper coating. Thus, a coating layer d as shown in FIG. 12C is formed on the laminate surface and the inner wall of the through hole c each.

Figure 12D:
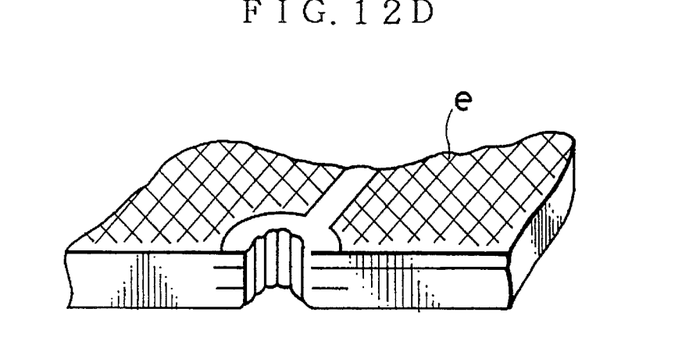
Figure 12E:
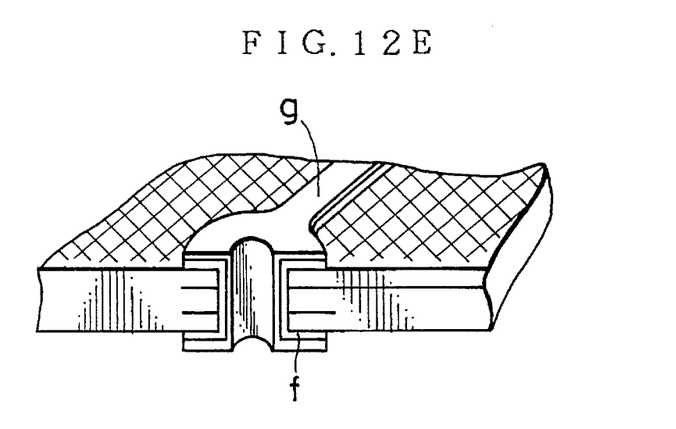
Figure 12F:
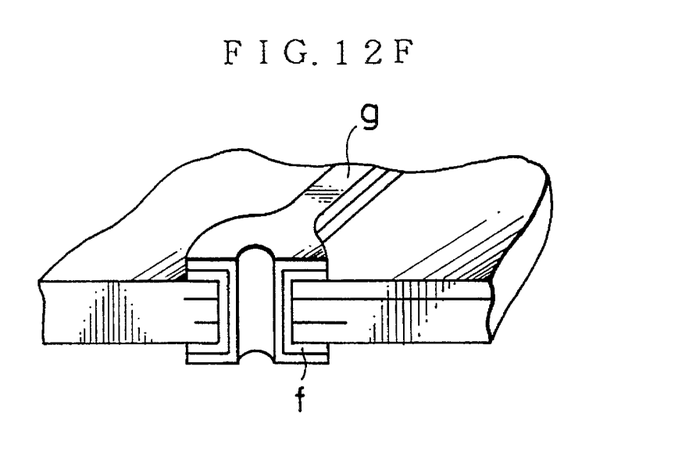
Figure 12G:
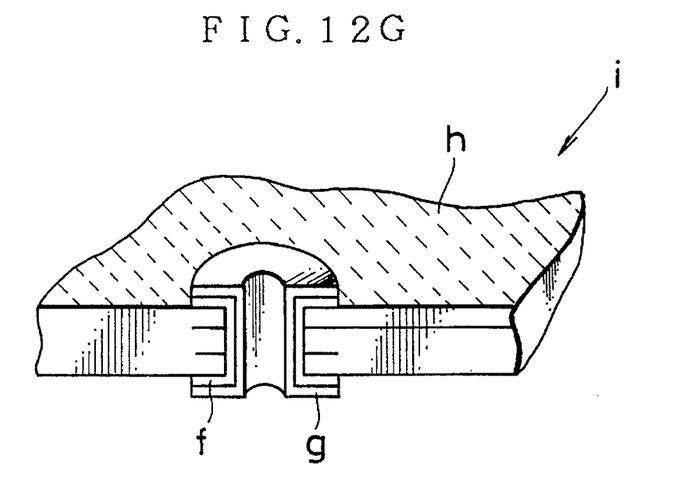

Next, on the surface of this chemical copper coating layer d, a photoresist layer e is patternwise formed except part of the surrounding of the through hole c and the part where the wiring layer is formed (see FIG. 12D). Also, at the part bared to the surface from this photoresist layer e, a copper electrolytic plating layer f and a solder plating layer g are successively formed (see FIG. 12E). After the photoresist layer e has been removed, the chemical copper coating layer d is removed by etching as shown in FIG. 12F, using the copper electrolytic plating layer f and the solder plating layer g as masks. Subsequently, on these layers, a solder resist layer h is formed to produce a multi-layer wiring board i as shown in FIG. 12G. Such a process has been hither to employed.

Figure 13:
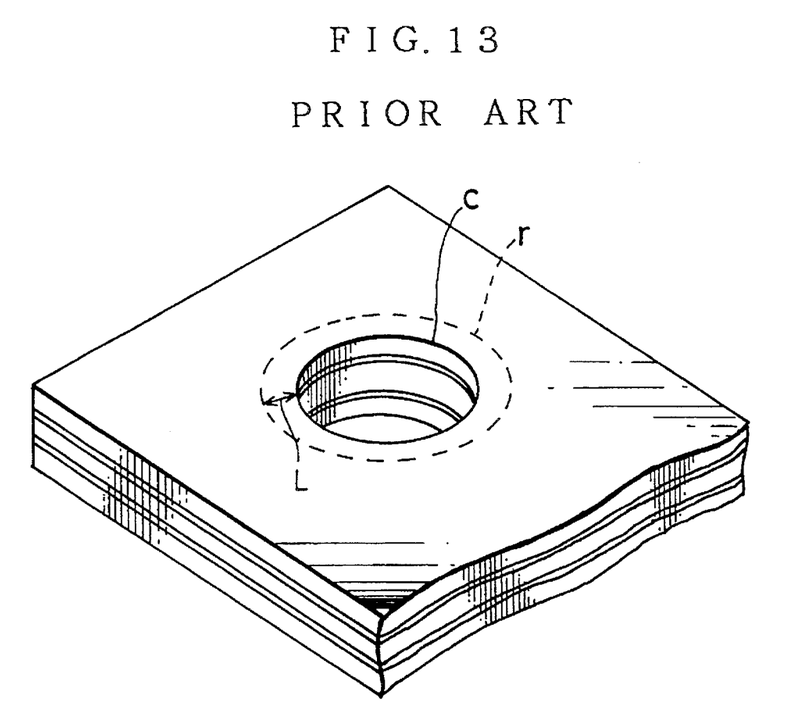
FIG. 13 is a partially enlarged view of a conventional multi-layer printed wiring board in which a through hole has been formed.

In this process, when the above plurality of inner-layer circuit boards are laminated via the adhesive insulating layers (prepregs), the wiring layer provided on each inner-layer circuit board has no sufficient adhesion to the adhesive insulating layer since the former is made of copper, and the wiring layer tends with time to separate from the adhesive insulating layer. Accordingly, in the conventional process, the surface of the patternwise formed copper wiring layer is treated with, e.g., an alkaline aqueous sodium chlorite solution in which about 15 to 25 g/lit. of sodium hydroxide (NaOH) is dissolved, to form an oxide film comprised of black and acicular crystals CuO so that the acicular crystals oxide film is interposed between the wiring layer and the adhesive insulating layer to improve the bond strength of the former to the latter. Such a method, what is called black oxide treatment, has been employed. Employment of this method has brought about an improvement the bond strength between the wiring layer and the adhesive insulating layer as a whole. On the other hand, the oxide film (blackened film) formed of CuO has a resistance to alkali solutions but dissolves in acid relatively with ease. Hence, when the chemical copper plating of the above through hole is carried out using a hydrochloric acid type aqueous palladium-tin solution in order to impart thereto catalytic properties against the chemical copper plating, the cross sections of layers, bared from the inner wall surface of the through hole come in contact with the acidic aqueous palladium-tin solution and the oxide film dissolves at its part coming in contact therewith, so that the metal copper of the wiring layer is bared and a pink-colored ring comes to appear along the periphery of the through hole c as shown in FIG. 13., which is a phenomenon called "haloing". Such a disadvantage has been caused in this method.

Moreover, when after the treatment with the hydrochloric acid type aqueous palladium-tin solution the copper electrolytic plating layer is formed at the part bared from the photoresist layer, it is known to use as a plating solution an alkaline copper pyrophosphate solution or an acidic copper sulfate solution. Since, however, the former copper pyrophosphate solution may cause a problem on waste liquor disposal, the latter copper sulfate solution shows a tendency to be widely used. Hence, the oxide film may dissolve as a result of the electrolytic plating making use of such an acidic copper sulfate solution, often resulting in an increase in size of the pink-colored ring.

The width (L) of the pink-colored ring caused by the treatment with the hydrochloric acid type aqueous palladium-tin solution or the electrolytic plating making use of the copper sulfate solution tends to increase with a decrease in diameter of the through hole c. For example, it is 100 μm or less in the case of a through hole of 0.8 mm diameter, while it is about 200 to 400 μm in the case of a through hole of 0.4 mm or less diameter in some instances.

Once such a phenomenon has occurred, a gap is formed at the interface between the wiring layer and the adhesive insulating layer on the inner wall of the through hole, so that the bond strength between these layers may become lower to tend with time for the layers to separate and also the treating solution tends to remain in the gap during the production process, bringing about a problem of a lowering of reliability for multi-layer wiring boards.

Under such technical background, with regard to the former disadvantage pattern disorder of wiring layers, a method is proposed in which the copper layer surface is roughened in a smaller extent and also roughened uniformly so that the adhesion between the photosensitive resist layer and the copper layer surface can be improved and the wiring patterns precision can be made higher. More specifically, Japanese Patent Application Laid-open No 6- 45729 discloses such a method, according to which the copper layer surface of a copper-clad laminate is subjected to black oxide treatment to form a blackened film, and subsequently the surface layer is dissolved using hydrochloric acid to remove the metal oxide film so that the copper layer surface can be roughened in a smaller extent and also roughened uniformly, to thereby prevent ethcing solution entering in the gap between the photosensitive resist layer and the copper layer surface.

As for the latter disadvantage haloing phenomenon, which may occur only in the production of multi-layer wiring boards, Japanese Patent Application Laid-open No. 2-58898 discloses a method for preventing it, according to which part of the copper oxide film (blackened film) formed by black oxide treatment is dissolved using a 1/30N to 1/10N sulfuric acid solution to modify the surface state of the oxide film (blackened film) so that the haloing can be prevented.

In the method disclosed in Japanese Patent Application Laid-open No. 6-45729, however, since the blackened film formed on the copper layer surface is dissolved using a hydrochloric acid solution to remove the metal oxide film, the roughened surface of the copper layer still has a metallic gloss and hence the multiple reflection tends to occur between the light-screening film surface and the copper layer roughened surface. Thus, there is room for a further improvement in order to make the precision of wiring patterns higher. Also, when a hydrochloric acid solution with a lower concentration is used as the treating solution, copper chloride may be deposited on the treated surface, the surface of the blackened film, and tends to remain on the surface, so that it becomes impossible to well achieve fine surface roughness of the copper layer surface. The method also involves such a problem.

In the methods disclosed in Japanese Patent Applications Laid-open No. 2-58898 and No. 6-45729, hydrochloric acid or sulfuric acid is used in the treating solution for dissolving the surface of the blackened film. In relation thereto, these methods have an additional problem that, when a plurality of copper-clad laminates are continuously treated in the same bath holding the treating solution comprising hydrochloric acid or the like, the pH of the treating solution varies with an increase in the quantity of CuO having dissolved in the bath so that the copper layer surface may be treated in a non-uniform extent to cause a lowering of reliability of the resulting printed wiring boards.

Frequent change of the treating solution in the bath for a new treating solution may make it possible to treat the copper layer surface in a uniform extent, but employment of such a measure brings about the problems of a poor work efficiency and a relatively high treatment cost.

SUMMARY OF THE INVENTION

The present invention was made taking account of such problems. Accordingly, an object thereof is to provide a process for producing a printed wiring board, that can form fine and highly precise wiring patterns.

Another object of the present invention is to provide a process for producing a printed wiring board, that can produce printed wiring boards having fine and highly precise wiring patterns by continuous and simple operation.

A still another object of the present invention is to provide a simple process for producing a printed wiring board, that can better prevent any defective adhesion between the copper wiring layer provided on the inner-layer circuit board and the adhesive insulating layer to make it hard for any treatments to remain at the interface between the wiring layer and the adhesive insulating layer when applied in the course of the production of multi-layer wiring boards grouped as one type of printed wiring boards.

A further object of the present invention is to provide a process for producing a printed wiring board, that can make via holes in a high precision in the insulating layer provided on wiring patterns.

A still further object of the present invention is to provide a process for producing a printed wiring board, that can avoid waste to make good use of materials even if the process is mis-operated during the production.

A still further object of the present invention is to provide a process for producing a printed wiring board, that can reduce the number of steps including the steps for preparing the starting material copper foil up to the steps for producing the finished product printed wiring board.

The present invention basically provides a process for producing a printed wiring board, comprising the steps of forming a photosensitive resist layer on a copper layer provided on an insulating substrate, patterning the photosensitive resist layer, and etching the copper layer made bare from the photosensitive resist layer to form a copper wiring layer, wherein;

the surface of the copper layer is subjected to pretreatment comprising the steps of black-oxide treating the surface by the use of an alkaline oxidizing solution and subsequently finely surface-roughening the black-oxide treated surface by the use of an acidic treating solution comprised of phosphoric acid or an organic acid, followed by drying in the presence of oxygen, and thereafter the photosensitive resist layer is formed thereon.

Other objects and preferred embodiments of the present invention will become apparent from the following description.

DESCRIPTION OF THE PREFERRED EMBODIMENTS

The present invention will be described below in detail.

The present invention is basically characterized by a process for producing a printed wiring board, comprising the steps of forming a photosensitive resist layer on a copper layer provided on an insulating substrate, patterning the photosensitive resist layer, and etching the copper layer made bare from the photosensitive resist layer to form a copper wiring layer, wherein;

the surface of the copper layer is subjected to pretreatment comprising the steps of black-oxide treating the surface by the use of an alkaline oxidizing solution and subsequently finely surface-roughening the black-oxide treated surface by the use of an acidic treating solution comprised of phosphoric acid or an organic acid, followed by drying in the presence of oxygen, and thereafter the photosensitive resist layer is formed thereon.

The process for producing a printed wiring board according to the present invention will be described below in detail with reference to FIG. 1.

A printed wiring board material (a copper-clad laminate) comprising an insulating substrate and a copper layer laminated to the whole surface thereof is first subjected to the step of mechanically polishing the copper layer surface by, i.e., buffing. There is no difference from the prior art in this regard. This step is less essential to the present invention, because this steps becomes unnecessary if there is no scratches or foreign matter on the copper layer surface of the printed wiring board material. Next, the copper layer surface may be optionally subjected to chemical polishing. In the present invention, the chemical polishing may be applied as occasion calls, and is still less essential to the present invention in the sense that the chemical polishing may be literally optionally applied and is often unnecessary. The copper layer in the printed wiring board material may be formed of copper foil or may be formed by physical or chemical film forming means such as copper plating or sputtering, any of which may be used.

Subsequently, the copper layer of the printed wiring board material is subjected to black oxide treatment using an alkaline oxidizing solution. This black oxide treatment is a treatment to form a film of cupric oxide CuO on the surface of the copper layer. As a result of this black oxide treatment, CuO acicular crystals are produced on the surface of the copper layer. However, the copper layer still has an irregular rough surface and hence causes a problem in its adhesion to the photosensitive resist layer such as a photosensitive dry film. In other words, there is a disadvantage such that a gap is formed between the copper layer surface and the photosensitive resist layer. Here, the rough surface is meant to be a surface on which the CuO acicular crystals are present in a thickness of about 1.0 μm or larger. As the alkaline oxidizing solution, known black-oxide treating solutions such as an alkaline aqueous sodium chlorite solution may be used.

Next, the copper layer surface thus treated is subjected to fine surface roughening using an acidic treating solution comprised of phosphoric acid or an organic acid. This fine surface roughening is effective for appropriately melt-etch the rough surface formed by the previous black oxide treatment, to convert it into a finely irregular surface. Here, the finely irregular surface is meant to be an irregular surface with a peak-to-valley distance of about 0.2 to 0.05 μm or less. Stated additionally, the film on the surface is presumed to have been changed from metallic copper (Cu) into cuprous oxide ($Cu_2O$). In any case, this treatment makes it possible to obtain the finely irregular surface which is a surface having a good adhesion to the photosensitive resist layer such as a photosensitive dry film. The acidic treating solution comprised of phosphoric acid or an organic acid, used in this fine surface roughening, has a better stability in pH than the treating solution comprising hydrochloric acid or sulfuric acid, disclosed in Japanese Patent Applications Laid-open No. 6-45729 and 2-58898, and hence has the advantage that the fine surface roughening can be made with less non-uniformity because of small variations of pH even when a plurality of printed wiring board materials (copper-clad laminates) are continuously treated using the same bath holding the acidic treating solution comprised of phosphoric acid or an organic acid. This treating solution has a further advantage that the copper oxide can be less deposited than the case when a hydrochloric acid solution with a low concentration is used.

Then, after the surface has been finely roughened with the acidic treating solution comprised of phosphoric acid or an organic acid is cleaned with water and also subjected to drying in the presence of oxygen. As a result of this drying, the copper layer surface turns blackish brown and the oxidation is promoted. The film thus formed, which is presumed to be composed of a mixture of CuO and $Cu_2O$, is not especially seen to adversely affect the formation of the finely irregular surface as aimed in the present invention and its adhesion to the photosensitive resist layer such as a photosensitive dry film, and also this oxidation can make light reflectance lower on the copper layer surface to make it possible to prevent the multiple reflection in the exposure treatment.

The subsequent steps are the same as those of the prior art process, i.e., the steps of forming the photosensitive resist layer such as a photosensitive dry film, subjecting this photosensitive resist layer to patternwise exposure and development, and subjecting the copper layer bared by the development to wet etching to form a copper wiring layer.

Figure 2:
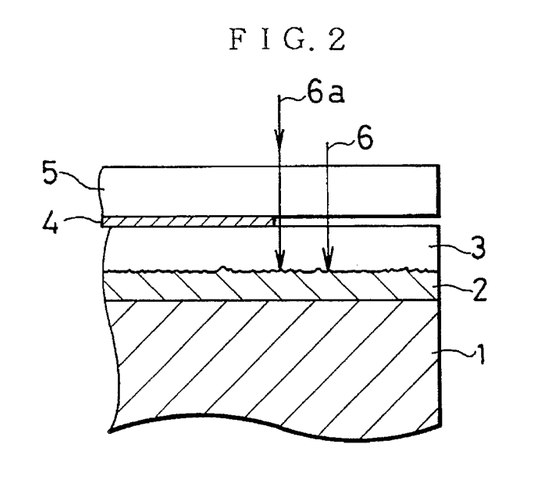
FIG. 2 illustrates how the step of exposure proceeds in the process for producing a printed wiring board according to the present invention.

FIG. 2 illustrates how the step of exposure proceeds in the process of the present invention. In FIG. 2, a copper layer 2 laminated to the surface of an insulating substrate 1 has the finely irregular surface and by no means causes any gap between the copper layer surface and the photosensitive resist layer. Moreover, since the copper layer has a low-reflective surface, the reflected light is in a very small intensity when incident light 6 reached the surface of the copper layer 2. Hence, the light can be free from repeated reflection, i.e., multiple reflection, and may cause no disorder of the form of photosensitive regions in the photosensitive resist layer. This disorder-free form is presumed to be taken over in the development and the etching to makes it possible to achieve highly precise patterns as a wiring layer.

When a plurality of inner-layer circuit boards having wiring layers formed by such a process are superposed via adhesive insulating layers and pressed with heating, the adhesive insulating layer can change its form along the finely irregular surface of the wiring layer, and hence the bond strength between the wiring layer and the adhesive insulating layer can be improved. Thus, in the subsequent treatment with an acidic treating solution (e.g., the hydrochloric acid type aqueous palladium-tin solution used before chemical copper plating, or the acidic copper sulfate solution used in electrolytic plating), it becomes hard for the acidic treating solution to penetrate the interface between the wiring layer and the adhesive insulating layer, so that it becomes possible to prevent the haloing from occurring and prevent the bond strength from lowering.

In the case when copper foil is used as the copper layer, the copper foil, before it is laminated to the insulating substrate, may also be subjected to the black oxide treatment and fine surface roughening described above and, after thus treated, the copper foil may be laminated to the insulating substrate to produce the printed wiring board. In this case, even if the black oxide treatment or the fine surface roughening is mis-operated during the production, what is wasted is only the copper foil having not been put together with the substrate, materials that may be wasted can be decreased, and the production cost can be decreased correspondingly.

When the steps starting from the preparation of copper foil and continuing to the pretreatment of the copper foil, the lamination of the treated copper foil to the insulating substrate and the patterning of the copper foil are continuously carried out, it is unnecessary for the copper foil to be beforehand surface-treated to prevent corrosion and thermal color change for the purpose of storage. Hence, it becomes possible to decrease the number of steps correspondingly and also to carry out continuous treatment according to a wind-up system, so that the pretreatment can be made simple. When copper foils are pretreated according to the wind-up system and thereafter not continuously laminated to insulating substrates, the copper foils wound up should be stored under conditions that may cause the treated surfaces not to corrode.

Such a process for producing a printed wiring board by using copper foil one side of which has been roughened and subjecting it to the above black oxide treatment and so forth before it is laminated to the insulating substrate will be described below in detail with reference to FIG. 3.

First, copper foil prepared by electrolysis or rolling and having been roughened on its side coming into contact with the insulating substrate is subjected to black oxide treatment using the alkaline oxidizing solution at least on the glossy-surface side (the unroughened-surface side) of the copper foil. As this copper foil, copper foil with any desired layer thickness may be used according to its uses. For example, those having layer thicknesses of about 72 μm, about 35 μm and about 18 μm may be used for inner layers, and those having layer thicknesses of about 35 μm, about 18 μm, about 12 μm and about 9 μm, for outer layers. Irregularities with a peak-to-valley distance of about 7 to 10 μm may be formed by the above roughening on the surface (herein called the roughened surface) to be laminated to the insulating substrate, and irregularities with a peak-to-valley distance of about 1 to 2 μm on the opposite side (herein called the glossy surface). It is unnecessary for the copper foil to be surface-treated to prevent corrosion and thermal color change for the purpose of storage, and hence it is also unnecessary to apply treatment such as mechanical polishing and chemical polishing to bare the copper foil surface.

Next, the copper foil is subjected to the fine surface roughening using the acidic treating solution comprised of phosphoric acid or an organic acid, followed by drying in the presence of oxygen. These successive black oxide treatment and fine surface roughening are made on the copper foil alone, and hence, as previously stated, what is wasted is only the copper foil even if such treatments are mis-operated during the production and also the wind-up type continuous treatment becomes possible since the copper foil alone is treated. These are additional advantages in this embodiment. The copper foil having been subjected to these successive pretreatment steps may be temporarily stored in the sate they are wound up or may be successively forwarded to the subsequent step where it is laminated to insulating substrates. More specifically, the copper foil having been subjected to these successive pretreatment steps is cut in a size which is substantially the same as that of the insulating substrate and then laminated thereto in the manner that its toughened surface comes in face-to-face contact with the insulating substrate via a suitable adhesive or prepreg interposed between them.

The insulating substrate may be comprised of glass fiber impregnated with epoxy resin. On such a substrate, the copper foil having been subjected to the successive pretreatment steps is superposed, and these may be put in a bell jar to carry out lamination under conditions as exemplified below. First, the bell Jar is evacuated, and thereafter nitrogen gas is led into it to adjust the inside to a vacuum of about 50 Torr, and the lamination may be carried out under conditions of a pressure of from 15 kg/cm$^2$ to 25 kg/cm$^2$, a pressing time of 120 minutes to 160 minutes and a heating temperature of from 170° C. to 200° C. With regard to the heating conditions, preheating at about 120° C. to 150° C. for 30 minutes may be carried out and then the temperature may be raised, whereby the insulating substrate can be prevented from warping to provide an advantage.

The steps subsequent to the lamination of the copper foil to the insulating substrate are the same as those of the prior art process shown in FIG. 10, i.e., the steps of laminating a photosensitive dry film, subjecting this dry film to patternwise exposure and development, and subjecting the copper layer patternwise bared by the development to wet etching to form a copper wiring layer.

Here, copper etch-left (a phenomenon where copper is left unetched in places because of a non-uniform thickness of copper foil) may occur if the copper foil has an excessively roughened surface on its side coming into contact with the insulating substrate. In such a case, copper foil not surface-roughened may be used and both sides of the copper foil may be subjected to the pretreatment comprising the steps of black-oxide treating the surfaces by the use of the alkaline oxidizing solution and subsequently finely surface-roughening the black-oxide treated surface by the use of the acidic treating solution comprised of phosphoric acid or an organic acid, followed by drying in the presence of oxygen, and thereafter the copper foil may be laminated to the insulating substrate. Namely, when the surface-unroughened copper foil is used, the copper etch-left can be prevented during the etching because of a uniform copper thickness compared with surface-roughened copper foils, and also a sufficient bond strength can be imparted to the interface between the copper foil and the insulating substrate because the copper foil surface on the side coming into contact with the insulating substrate has been also finely surface-roughened by the black oxide treatment using the alkaline oxidizing solution and the fine surface roughening using the acidic treating solution.

In the case when the above copper foil is used as the copper layer, it may become difficult to continuously carry out the successive pretreatment on the copper foil alone if the copper foil has a small thickness. In such a case, the copper foil may be provided with a prepreg or a resin layer on its one side coming into contact with the insulating substrate, before it is subjected to, or after it has been subjected to, the pretreatment of black oxide treatment and fine surface roughening.

Figure 1:
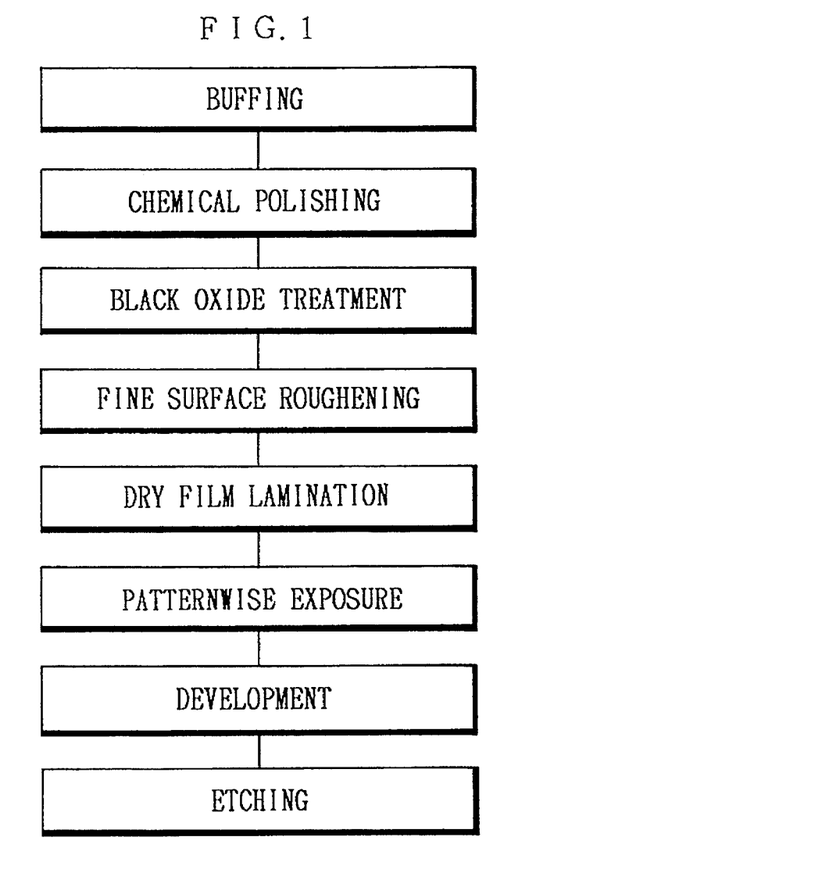
FIG. 1 is a flow chart to illustrate the order of steps in the process for producing a printed wiring board according to an embodiment of the present invention.
Figure 3:
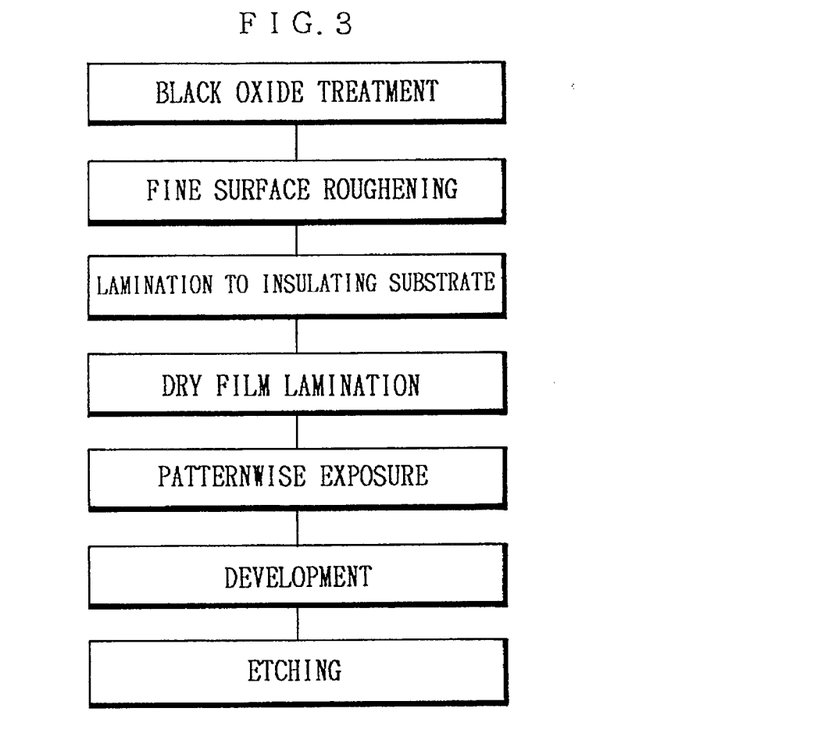
FIG. 3 is a flow chart to illustrate the order of steps in the process for producing a printed wiring board according to another embodiment of the present invention.

The copper wiring layer formed by either process shown in FIG. 1 or 3 can be used as a first wiring layer, and a second wiring layer and further wiring layers can be successively provided on the first wiring layer via insulating layers by the "build-up process" to obtain a multi-layer printed wiring board. In such a case also, the first wiring layer copper layer, having a finely irregular and low-reflective surface, can effectively act to improve the working precision of via holes in the insulating layers.

Figure 4:
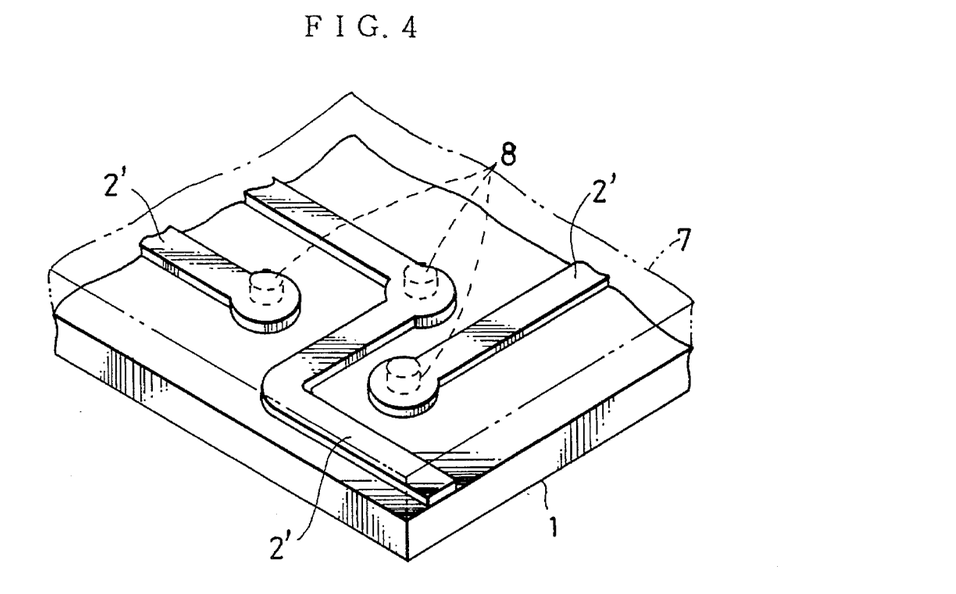
FIG. 4 is a schematic perspective view of a printed wiring board in the course of its production by a build-up process.

More specifically, on the first wiring layer formed through the above pretreatment, a photosensitive resin layer is provided, and this photosensitive resin layer is patterned to form an insulating layer having via holes. In such a case, since the copper layer surface constituting the first wiring layer has a finely irregular and low-reflective surface, a good adhesion can be achieved between the wiring layer and the photosensitive resin layer. Also, when this photosensitive resin layer is patternwise exposed in a desired form through an exposure mask, the multiple reflection between the exposure mask and the first wiring layer may hardly occur. Thus, when, as shown in FIG. 4, via holes which are positioned on a first wiring layer 2' on an insulating layer 7 and establish electrical connection with a second wiring layer (not shown) are formed, they can be provided in a high precision.

In the above build-up process, the same process as in conventional methods can be ueed as it is, except that the black oxide treatment and fine surface roughening previously described are applied to the copper layer surface constituting the first wiring layer. More specifically, after the first wiring layer has been formed, a photosensitive resin layer formed of an epoxy resin, an acrylic resin, a polyimide resin, an epoxyacrylate resin or the like is formed on the first wiring layer. In order to prevent the resin from shrinking by heat in subsequent steps such as the steps of provisional curing, exposure curing, and drying, the resin may preferably be incorporated with a filler such as alumina, silicon dioxide, talc or barium sulfate.

After the step of provisional curing optionally carried out (when a solvent type photosensitive resin is used, this provisional curing is carried out to evaporate the solvent), the photosensitive resin layer is patternwise exposed in a desired form, followed by development, and further followed by baking (drying) and buffing to form an insulating layer provided with via holes. Next, the insulating layer is surface-roughened, and then pretreated for electrolytic plating (treatment for removing the oxide film of the first wiring layer bared through the via holes, to prevent any faulty electrical connection between the first wiring layer and the second wiring layer). Thereafter, a metal film for the second wiring layer is formed by electroless plating or electrolytic plating, followed by its patterning to form the second wiring layer. Subsequently, these steps are optionally repeated to successively form a third wiring layer, a fourth wiring layer and so on. Thus, the desired printed wiring board can be obtained.

Next, in the step of drying in the presence of oxygen after the pretreatment comprising the steps of black-oxide treating the surfaces by the use of the alkaline oxidizing solution and subsequently finely surface-roughening the black-oxide treated surface by the use of the acidic treating solution comprised of phosphoric acid or an organic acid, this drying may preferably be carried out under heating, because the drying can be completed in a shorter time and the oxidation of the copper layer surface can be accelerated to more decrease its light reflectance. Such heating may be carried out under conditions of, for example, a temperature of from 60° C. to 140° C., a heating time of from 15 minutes to 2 hours, and preferably 120° C. and 1 hour.

The acidic treating solution used in the fine surface roughening may specifically include aqueous solutions of phosphoric acid or an organic acid such as acetic acid, tartaric acid or citric acid, or acidic buffer solutions making use of any of these acids. In particular, aqueous solutions of phosphoric acid or citric acid and buffer solutions of any of these have a good pH stability, and are advantageous in that the treatment capacity may lower with difficulty because of less variations of pH even when copper layers are continuously treated for their fine surface roughening using the same bath holding such a treating solution. Like the buffer solutions, aqueous solutions of organic acids of 3.00 as a logarithm of the reciprocal of acid dissociation constant as exemplified by glycine, bromoacetic acid, salicylic acid, (R,R)-tartaric acid, chloroacetic acid and 2-chloropropionic acid are also good because of less variations of pH during the fine surface roughening, and can be preferably used.

The phosphoric acid or citric acid type treating solution used may have a pH of 0 to 3, and preferably a pH of 1.5 to 2.5, because the use of a strongly acidic solution with a pH of less than 0 may cause the surface to be smoothened without formation of fine irregularities. On the other hand, the use of an weakly acidic solution with a pH of more than 3 is possible but may require a long time to dissolve and remove CuO and to form fine irregularities, resulting in a great lowering of treatment efficiency.

The dissociation constant of acidic solutions changes depending on temperatures and the pH thereof also changes depending on temperatures. Hence, in adjusting the pH, attention must be paid to temperature conditions for the fine surface roughening. The fine surface roughening of the copper layer may be carried out at from room temperature to about 80° C., and this treatment may preferably be applied until the reaction of the treating solution with the copper layer comes to equilibrium, and usually for a time of from 15 seconds to 5 minutes. The phosphoric acid has a higher degree of dissociation than the citric acid, and has the advantage that the treatment with acid can be carried out at a lower treating solution temperature.

The phosphoric acid type treating solution with a pH of 0 to 3 may include an aqueous phosphoric acid solution and buffer solutions prepared by adding a suitable amount of disodium hydrogenphosphate or trisodium phosphate to the aqueous phosphoric acid solution. The citric acid type treating solution with a pH of 0 to 3 may include an aqueous citric acid solution and buffer solutions prepared by adding a suitable amount of disodium hydrogenphosphate or potassium citrate to the aqueous citric acid solution. The treating solution may also include buffer solutions prepared by adding a suitable amount of a citric acid/potassium dihydrogenphosphate/boric acid/diethylbarbituric acid system or a boric acid/citric acid/citric acid system to an aqueous solution of trisodium phosphate.

As the insulating substrate usable in the present invention can be exemplified by organic material substrates made of glass fiber impregnated with an epoxy resin, a polyimide resin or bismaleimide triazine, ceramic material substrates made of alumina or aluminum nitride, glass substrates, and substrates comprising a metallic substrate of copper or aluminum, having been anodized or coated with an insulating material to apply insulating treatment. It is also possible to use substrates of a fluorine resin type such as polytetrafluoroethylene resin. Single-sided copper-clad laminates or double-sided copper-clad laminates comprising any of these substrates and a copper layer(s) provided on one side or both sides thereof are also widely used.

The photosensitive resist layer formed on the copper layer having been subjected to the pretreatment previously described can be exemplified by photosensitive dry films (e.g., H-S940, trade name, available from Hitachi Chemical Co., Ltd.), coatings formed using liquid resists (e.g., PMER, trade name, available from Tokyo Ohka Kogyo Co., Ltd.), and electrodepositing resists (e.g., PHOTOIMAGE ED TH-1, trade name, available from Toagosei Chemical Industry Co., Ltd.). To carry out the etching, etching solutions commonly used in the production of conventional printed wiring boards can be used, as exemplified by an aqueous cupric chloride solution and alkaline etching solutions such as an ammonium chloride solution and an ammonium sulfate solution.

As describe above, according to the present invention, fine and uniform irregularities are formed on the copper layer surface provided on the insulating substrate. Hence the adhesion between the copper layer and the photosensitive resist layer can be improved, and concurrently the etching solution can be prevented from entering in the interface between the copper layer surface and the photosensitive resist layer. Since also the pretreated copper layer surface is dried in the presence of oxygen, the light reflectance from the copper layer can be decreased to enable prevention of the pattern form disorder of photosensitive regions during the patternwise exposure. Thus, copper wiring layer with a small line width can be formed in a high precision and also via holes can be formed in a high precision when the insulating layer formed of a photosensitive resin is provided on the wiring layer.

Since the adhesive insulating layer can change its form along the fine and uniform irregular surface of the wiring layer when a plurality of inner-layer circuit boards having wiring layers having the surface configuration described above are superposed via adhesive insulating layers to produce a multi-layer wiring board, the bond strength between the wiring layer and the adhesive insulating layer can also be improved. Hence, in the subsequent treatment with an acidic treating solution (e.g., the hydrochloric acid type aqueous palladium-tin solution used before chemical copper plating, or the acidic copper sulfate solution used in electrolytic plating), it becomes hard for the acidic treating solution to penetrate the interface between the wiring layer and the adhesive insulating layer, so that it becomes possible to prevent the haloing from occurring and prevent the bond strength from lowering.

Moreover, since the acidic treating solution comprised of phosphoric acid or an organic acid, used in the fine surface roughening, has a better stability in pH than the treating solution comprising hydrochloric acid or sulfuric acid used in the prior art, and hence has the advantage that the management of treating solutions in the fine surface roughening can be made simple because of small variations of pH even when a plurality of printed wiring board materials are continuously treated using the same bath holding the acidic treating solution comprised of phosphoric acid or an organic acid.

In the case when the copper layer is formed of copper foil, the copper foil, before it is laminated to the insulating substrate, can be subjected to the black oxide treatment using the alkaline oxidizing solution and the fine surface roughening using the acidic treating solution, and hence, even if such pretreatment is mis-operated, what is wasted is only the copper foil, so that the production cost can be descreased. It also becomes possible to carry out continuous treatment according to a wind-up system, so that the pretreatment can be made simple. It also become unnecessary for the copper foil to be beforehand surface-treated to prevent corrosion and thermal color change for the purpose of storage when the steps for the preparation of copper foil, the pretreatment of the copper foil, the lamination of the treated copper foil to the insulating substrate and the patterning of the copper foil are continuously carried out. Hence, it becomes possible to decrease the number of steps correspondingly.

Experiments

To ascertain fine surface roughening performance chiefly of phosphoric acid type treating solutions, the following experiments were made.

Phosphoric Acid Concentration and pH

Figure 5:
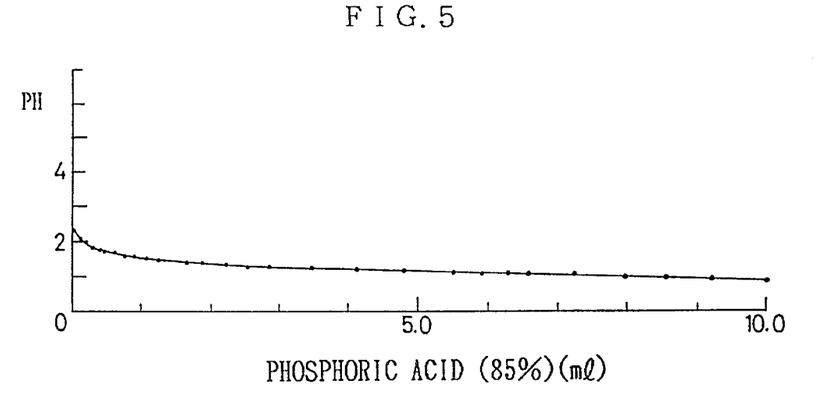
FIG. 5 is a graph to show the relationship between the amount (ml) of phosphoric acid dropwise added and the pH, ascertained in an experiment.

First, in 100 ml of water, phosphoric acid (85%, available from Kanto Chemical Co., Inc.) was added in an increasing amount to ascertain changes in pH of the aqueous solution. Results obtained are shown in FIG. 5.

pH Stability of Phosphoric Acid Solution (1)

Next, with reference to the above results, the following six kinds (a to f) of treating solutions were prepared so that the aqueous solutions have a pH of about 1.8.

a. Phosphoric acid 0.36%; pH: 1.78 b. Phosphoric acid 3.4% +trisodium phosphate 33.0 g/lit.; pH: 1.70 c. Phosphoric acid 5.95% +trisodium phosphate 74.5 g/lit.; pH: 1.67 d. Phosphoric acid 8.50% +trisodium phosphate 110 g/lit.; pH: 1.62 e. Phosphoric acid 17.0% +trisodium phosphate 293 g/lit.; pH: 1.82 f. Citric acid 40 g/lit.; pH: 1.49

In 300 ml of these six kinds of treating solutions (aqueous solution, 40° C.), 1N NaOH was added in an increasing amount to examine changes in pH of the aqueous solution. Results obtained are shown in FIG. 6.

Figure 6:
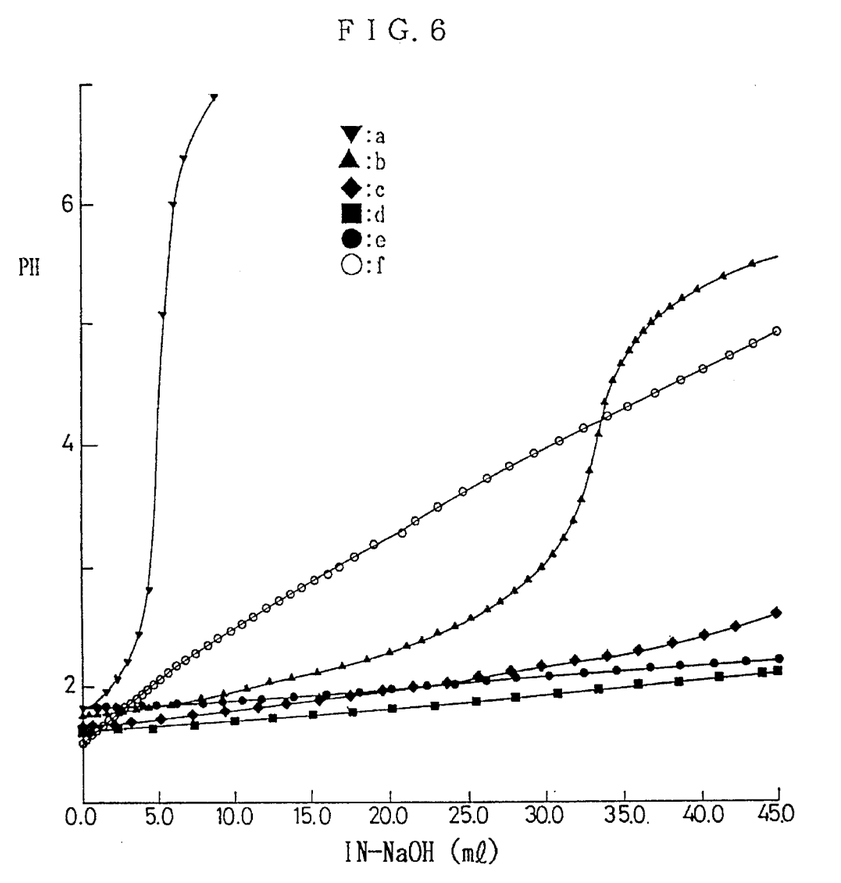
FIG. 6 is a graph to show the relationship between the amount (ml) of 1N NaOH dropwise added and the pH in various treating solutions, ascertained in an experiment.

As is seen from the graph shown in FIG. 6, it was ascertained that phosphate buffer solutions with a certain concentration or higher showed better pH stability than the aqueous citric acid solution f.

pH Stability of Phosphoric Acid Solution (2)

Figure 7:
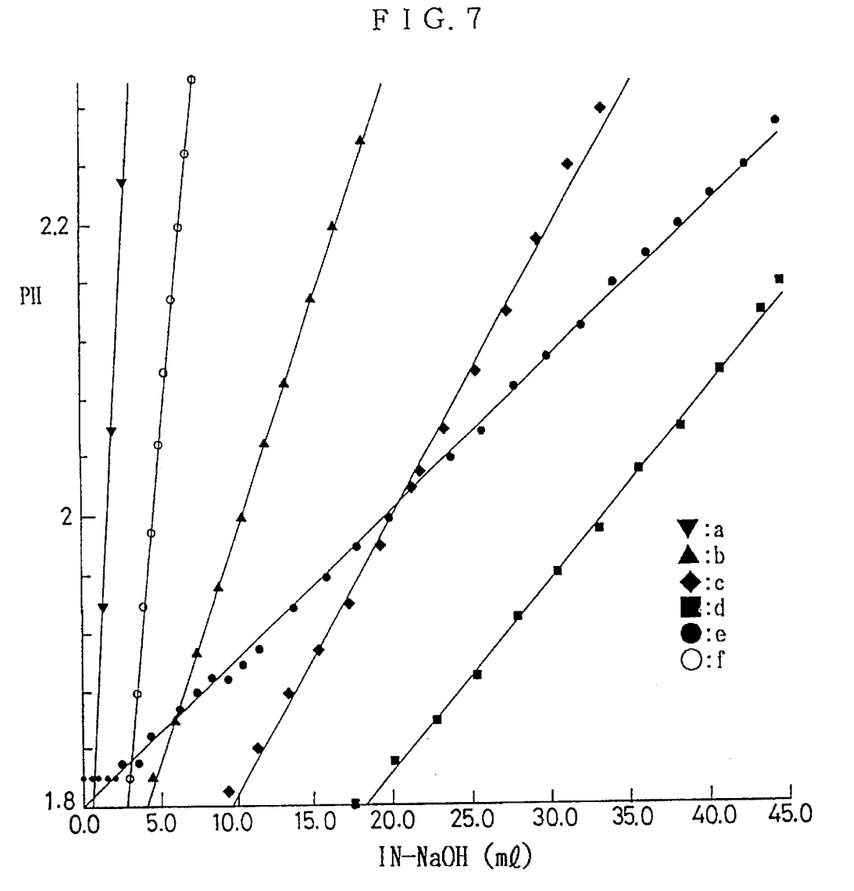
FIG. 7 is a partially enlarged view of FIG. 6.

Next, optimum concentrations of phosphoric acid in phosphoric acid type treating solutions were determined taking account of the balance of pH stability and bath make-up cost. Since it had been ascertained from the results of an experiment made using a citric acid type treating solution that the pH value suited for the fine surface roughening was 2.3 or below, the graph of FIG. 6 was enlarged in respect of the range of pH 1.8 to 2.3 to again plot the data. Results obtained are shown in FIG. 7. On these treating solutions a to f, regression coefficients were found and differentiated to obtain the results as shown below. The smaller the value is, the less the pH changes.

a. Y'=1.648×10⁻¹ b. Y'=3.118×10⁻² c. Y'=1,919×10⁻² d. Y'=1,313×10⁻² e. Y'=1.021×10⁻² f. Y'=1.018×10⁻¹ pH Stability of Phosphoric Acid Solution (3)

Then, the phosphoric acid concentrations in the phosphoric acid type treating solutions were plotted as an abscissa to make up a graph, and changes of the differential values were examined. Results obtained are shown in FIG. 8.

Figure 8:
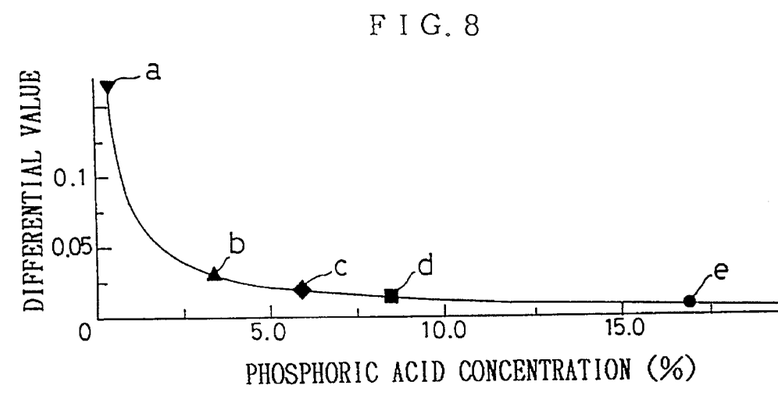
FIG. 8 is a graph to show the relationship between the concentration of phosphoric acid in a phosphoric acid type treating solution and the differential value, ascertained in an experiment.

As is seen from the graph shown in FIG. 8, the pH stability little improves after the phosphoric acid concentration in the phosphoric acid type treating solution has reached around 10%. As a result, it has been ascertained that the treating solutions can be best efficiently used in a phosphoric acid concentration of around 10% (i.e., both the pH stability and the treatment cost reduction can be achieved) and in the present samples the treating solution of phosphoric acid 8.50%+trisodium phosphate 110 g/lit. (d) has composition contributing the best efficiency.

CuO Dissolving Quantity and pH Stability of Treating Solutions

In regard to the following three kinds of treating solutions, the treating solutions were artificially fatigued by adding copper chloride powder, to examine the time of deposition of complexes. More specifically, CuO powder was added to 1,000 ml of the following treating solutions in an increasing amount to examine how the pH changes and whether or not precipitates appear. From the test results, it can be seen how many sheets of printed wiring board materials (copper-clad laminates) can be continuously processed (i.e., treatment capacity) using the same bath without changing treating solutions for new ones.

(1) Sulfuric acid type treating solution: 0.1% by volume (liquid temperature: room temperature)

(2) Citric acid type treating solution: Citric acid 41.2 g/lit. +$Na_2HPO_4$ 0.6 g/lit. (liquid temperature: 65° C.).

(3) Phosphoric acid type treating solution: Phosphoric acid 8.50% +trisodium phosphate 110 g/lit. (the above d.) (liquid temperature: (liquid temperature: 40° C.).

Figure 9:
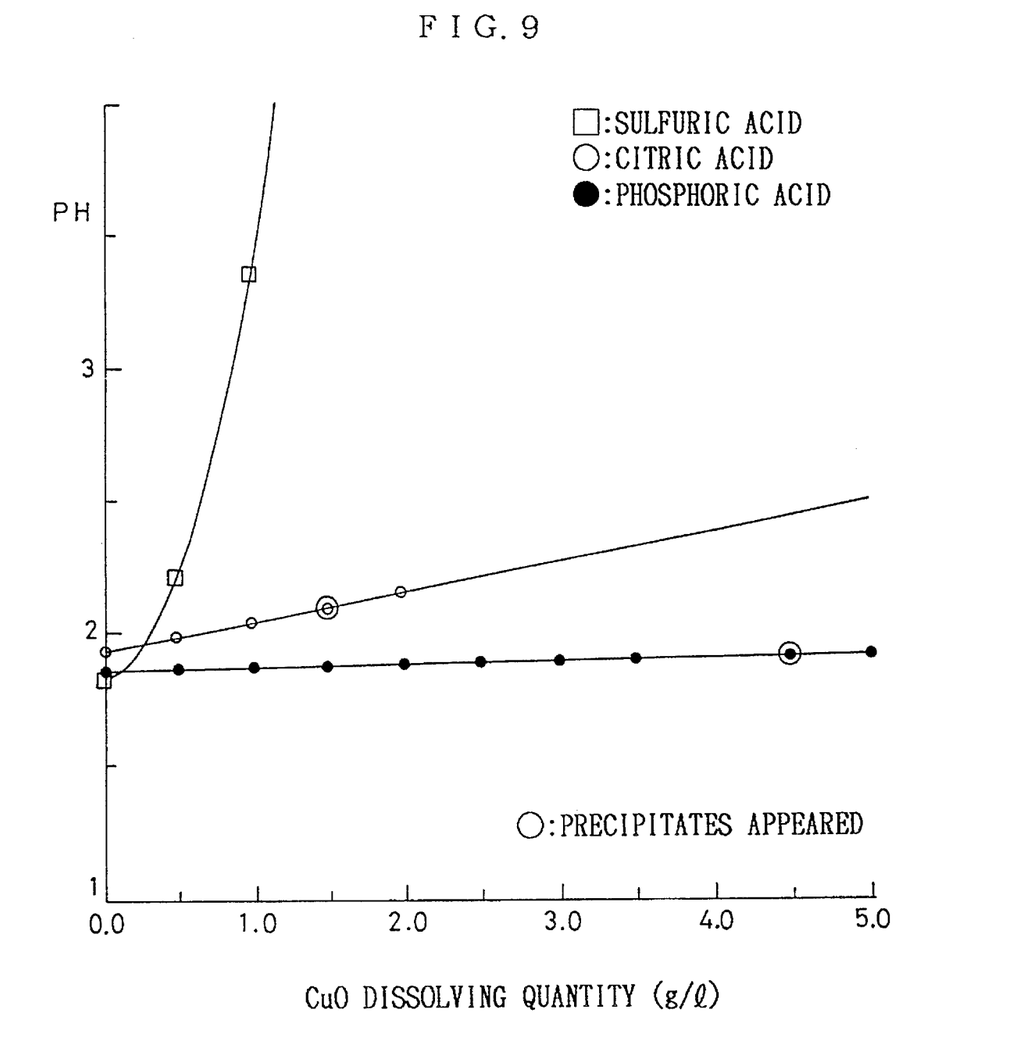
FIG. 9 is a graph to show the relationship between the quantity (g/lit.) of CuO dissolving in various treating solutions and the pH, ascertained in an experiment.

Results obtained are shown in FIG. 9 and in Table 1 below.

TABLE 1

| CuO (g/lit.) | Phosphoric acid (pH) | Citric acid (pH) | Sulfuric acid (pH) |
|---|---|---|---|
| 0 | 1.86 | 1.93 | 1.83 |
| 0.5 | 1.87 | 1.98 | 2.21 |
| 1.0 | 1.88 | 2.05 | 3.37 |
| 1.5 | 1.88 | 2.11 | * |
| 2.0 | 1.89 | ** | " |
| 2.5 | 1.90 | " | " |
| 3.0 | 1.91 | " | " |
| 3.5 | 1.92 | " | " |
| 4.5 | 1.94 | " | " |
| 5.0 | 1.96 | " | " |

*Stopped since the pH became more than 3.
**Stopped since complexes were deposited.

As is seen from these results, the phosphoric acid type treating solution and the citric acid type treating solution make CuO dissolve in a larger quantity and also have a better pH stability than the sulfuric acid type treating solution. Treatment capacity (the number of sheets treatable in one bath without change)

From these results, the number of sheets treatable in each treating solution was calculated.

Here, one sheet copper-clad laminate with double-side full-clad copper foil of 510 mm×609 mm in size corresponding to a relatively large-sized printed wiring board is subjected to black oxide treatment to form CuO on the surfaces. The quantity of CuO having dissolved out of the double-side full-clad copper foil is 2.678 g in terms of Cu (Cu: molecular weight 63.5; CuO: molecular weight 79.5), and calculation in terms of the quantity of CuO follows.

2.67:63.5=x: 79.5, and therefore x=3.34 g

Each treating bath has a capacity of 100 liters.

(1) The number of sheets treatable in sulfuric acid type treating solution:

As is seen from the graph of FIG. 9 showing the relationship between the quantity of CuO dissolving in treating solutions (CuO dissolving quantity) and the pH of the solutions, the pH becomes more than 3 at a CuO dissolving quantity of about 0.85 g/lit.

Since in the 100 liter treating bath the pH becomes more than 3 when CuO is in a quantity of 85 g, it follows that the number of sheets treatable in it comes to be 85/3.34=25.4 sheets.

Thus, it is understood that the use of the sulfuric acid type treating solution makes it necessary to change the treating solution after treatment on about 25 sheets to make management of the treating solutions troublesome.

(2) The number of sheets treatable in citric acid type treating solution:

As is seen from the graph of FIG. 9 showing the relationship between the CuO dissolving quantity and the pH, precipitates appear at a CuO dissolving quantity of about 1.5 g/lit to make it difficult to carry out further treatment. Then, since in the 100 liter treating bath it becomes difficult to carry out further treatment when CuO is in a quantity of 150 g, it follows that the number of sheets treatable in it comes to be 150/3.34=44.9 sheets.

Thus, it is understood that the use of the citric acid type treating solution makes management of the treating solutions simple compared with the case when the sulfuric acid type treating solution is used.

(3) The number of sheets treatable in phosphoric acid type treating solution:

As is seen from the graph of FIG. 9 showing the relationship between the CuO dissolving quantity and the pH, precipitates appear at a CuO dissolving quantity of about 4.5 g/lit to make it difficult to carry out further treatment. Then, since in the 100 liter treating bath it becomes difficult to carry out further treatment when CuO is in a quantity of 450 g, it follows that the number of sheets treatable in it comes to be 450/3.34=134.7 sheets.

Thus, it is understood that the use of the phosphoric acid type treating solution makes management of the treating solutions simple compared with the case when the sulfuric acid type treating solution is used.

The present invention will be described below in greater detail by giving Examples.

EXAMPLE 1

A copper-clad laminate (340 mm×510 mm×0.3 mm) comprised of glass fiber having a 18 μm thick copper foil laminated to the top and back both sides and impregnated with epoxy resin was used, and its surfaces were subjected to buffing and thereafter subjected to black oxide treatment under the following conditions.

| Composition of black-oxide treating solution: | |
|---|---|
| NaOH | 21 g/lit. |
| NaClO$_2$ | 43 g/lit. |
| Na$_3$PO$_4$.12H$_2$O | 17 g/lit. |
| Treatment temperature: | 90° C. |
| Treatment time: | 4.5 minutes |

The copper foil surfaces having been thus black-oxide treated had a blackish layer seen to comprise CuO acicular crystals. This copper-clad laminate having copper foil having been black-oxide treated was immersed in an acidic treating solution shown below, to carry out the fine surface roughening of the copper foil.

| Composition of acidic treating solution: | |
|---|---|
| Citric acid | 41 g/lit. |
| Na$_2$HPO$_4$ | 0.57 g/lit. |
| Temperature of acidic treating solution: | 60 to 65° C. |
| Treatment time: | 3 minutes |

The copper foil surfaces having been thus finely surface roughened had a red color (the color of Cu or Cu$_2$O), but turned blackish-brown as a result of washing with water and then drying while heating at 120° C. for 1 hour. The resulting copper foil surfaces were observed using a scanning electron microscope to find that, while relatively large acicular crystals were observed on the copper foil surfaces right after the black oxide treatment, no acicular crystals were seen on the copper foil surfaces having been subjected to the fine surface roughening and surfaces with irregularities finer than acicular crystals were formed.

Subsequently, a photosensitive dry film having a photosensitive layer of 30 μm thick was laminated to each side of the copper foil, and a wiring layer pattern with a line-and-space of 50 μm/50 μm was printed thereon by flood exposure. Then the resulting dry film was subjected to development by a conventional process, followed by wet etching using a given copper etching solution to form a wiring layer. After the dry film was stripped, the surface was observed using a scanning electron microscope to reveal that the pattern of a 18 μm thick wiring layer had a top width of 38 μm and a bottom width of 45 μm, showing a very good pattern precision with an etch factor of 5.1 and with a pattern side wall having a linear form in cross section.

EXAMPLE 2

Example 1 was repeated except that, after the black oxide treatment was carried out in the same manner, the fine surface roughening was carried out using the following acidic treating solution under the following conditions.

| Composition of acidic treating solution: | |
|---|---|
| H$_3$PO$_4$ | 87 g/lit. |
| Na$_3$PO$_4$.12H$_2$O | 110 g/lit. |
| Temperature of acidic treating solution: | 40° C. |
| Treatment time: | 2 minutes |

Subsequently, a photosensitive dry film having a photosensitive layer of 20 μm thick was laminated, and a wiring layer pattern with a line-and-space of 30 μm/30 μm was printed thereon by flood exposure. Then the resulting dry film was subjected to development by a conventional process, followed by wet etching using a given copper etching solution to form a wiring layer. After the dry film was stripped, the surface was observed using a scanning electron microscope to reveal that the pattern of a 18 μm thick wiring layer had a top width of 22 μm and a bottom width of 30 μm, showing a very good pattern precision.

EXAMPLE 3

A 18 μm thick copper foil prepared by electrolysis and surface-roughened on its side coming into contact with an insulating substrate (comprised of glass fiber impregnated with epoxy resin) was immersed in the following black-oxide treating solution to subject its glossy surface side and roughened surface side to black oxide treatment under the following conditions.

| Composition of black-oxide treating solution: | |
|---|---|
| NaOH | 21 g/lit. |
| NaClO$_2$ | 43 g/lit. |
| Na$_3$PO$_4$.12H$_2$O | 17 g/lit. |
| Treatment temperature: | 95° C. |
| Treatment time: | 4.5 minutes |

The copper foil surfaces having been thus black-oxide treated had a blackish layer seen to comprise CuO acicular crystals. This copper foil having been black-oxide treated was immersed in a citric acid type treating solution shown below, to apply acid treatment to the glossy surface side and roughened surface side to carry out fine surface roughening.

| Composition of citric acid type treating solution: | |
|---|---|
| Citric acid | 41.2 g/lit. |
| Na$_2$HPO$_4$ | 0.6 g/lit. |
| pH of citric acid type treating solution: | about 2.0 |
| Temperature of treating solution: | 65° C. |
| Treatment time: | 2.5 minutes |

The copper foil surfaces having been thus treated with acid had a red color (the color of Cu or Cu$_2$O), but turned nearly blackish gray as a result of washing with water and then drying while heating at 120° C. for 1 hour. Both sides of this copper foil were observed using a scanning electron microscope to find that, while relatively large acicular crystals were observed on the both copper foil surfaces right after the black oxide treatment, no acicular crystals were seen on the copper foil surfaces having been subjected to the fine surface roughening and surfaces with irregularities finer than acicular crystals were formed.

Subsequently, this copper foil was cut in substantially the same size as that of the insulating substrate (comprised of glass fiber impregnated with epoxy resin). This copper foil was superposed on the insulating substrate, which were then put in a bell jar to carry out lamination under the following conditions.
(Lamination conditions)
  Atmosphere: After evacuated, nitrogen gas was led in to adjust the inside to a vacuum of about 50 Torr.
  Pressure: 20 kg/cm$^2$
  Pressing time: 140 minutes
  Heating temperature: Preheated at 120° to 150° C. for about 30 minutes, and thereafter set at 180° C.

Next, to the copper foil surface (glossy surface side) laminated to the insulating substrate, a photosensitive dry film (trade name: H-S940, available from Hitachi Chemical Industry Co., Ltd.) was laminated, and a wiring layer pattern with a line-and-space of 50 µm/50 µm was printed thereon by flood exposure. Then the resulting dry film was subjected to development by a conventional process, followed by wet etching using a given copper ethcing solution to form a wiring layer. After the dry film was stripped, the surface was observed using a scanning electron microscope to reveal that the pattern of a 18 µm thick wiring layer had a top width of 38 µm and a bottom width of 45 µm, showing a very good pattern precision with an etch factor of 5.1 and with a pattern side wall having a linear form in cross section.

On the copper foil thus patterned, a photosensitive resin (trade name: BROBIMER 52, available from Ciba-Geigy Corp.) was coated, followed by exposure and development to remove the resin at via holes in the copper foil to form an insulating layer. In the formation of this insulating layer also, no gap was produced between the photosensitive resin and the copper foil surface since fine irregularities were formed on the surface of the copper foil, and also it was possible to form an insulating layer having via holes in a good work precision since the copper foil surface was a low-reflective surface.

EXAMPLE 4

Example 3 was repeated except that a 18 µm thick copper foil prepared by electrolysis and not surface-roughened on its side coming into contact with the insulating substrate (comprised of glass fiber impregnated with epoxy resin) was used and the copper foil having been subjected to the black oxide treatment in the same manner was subjected to fine surface roughening under the following conditions, where similar results were obtained.

| Composition of phosphoric acid type treating solution: | |
|---|---|
| Phosphoric acid (phosphoric acid concentration: 8.50% by weight) | |
| Trisodium phosphate | 110 g/lit. |
| pH of phosphoric acid type treating solution: | about 1.62 |
| Temperature of treating solution: | 40° C. |
| Treatment time: | 2.0 minutes |

EXAMPLE 5

Example 3 was repeated except that a 18 µm thick copper foil prepared by electrolysis and not surface-roughened on its side coming into contact with the insulating substrate (comprised of glass fiber impregnated with epoxy resin) was used and the copper foil having been subjected to the black oxide treatment in the same manner was subjected to fine surface roughening under the following conditions, where similar results were obtained.

| Composition of citric acid type treating solution: | |
|---|---|
| Citric acid | 41.2 g/lit. |
| Na$_2$HPO$_4$ | 1.1 g/lit. |
| pH of citric acid type treating solution: | about 2.30 |
| Temperature of treating solution: | 65° C. |
| Treatment time: | 2.5 minutes |

EXAMPLE 6

The printed wiring board obtained in Example 1 was used as an inner-layer circuit board, which was prepared in plurality. The inner-layer circuit boards obtained and outer-layer copper foils were superposed via adhesive insulating layers under application of heat and pressure to laminate them.

In the resulting laminate, holes were bored by drilling in the same manner as usual to form through holes of 0.35 mm diameter each. Thereafter, the inner walls of the through holes were treated with a hydrochloric acid type aqueous palladium-tin solution and also by chemical copper plating, further followed by conventional treatment such as washing with water and pickling. Also, a photoresist layer was formed in the same manner as usual, followed by electrolytic copper plating under the following conditions.

| Composition of plating solution: | |
|---|---|
| $CuSO_4 \cdot 5H_2O$ | 60 to 70 g/lit. |
| $H_2SO_4$ | 200 to 210 g/lit. |
| Plating temperature: | room temperature |
| Current density: | about 1.8 $A/dm^2$ |
| Coating thickness: | about 15 μm |

Next, in the same manner as usual, solder plating, photoresist layer stripping, etching, solder resist layer formation and so forth were successively carried out to produce a multi-layer wiring board.

In regard to the multi-layer wiring board thus obtained, it was attempted to measure the diameters of pink rings, but no pink ring was found.

Meanwhile, in regard to the above inner-layer circuit boards, their copper foils were immersed in the black-oxide treating solution and the citric acid type treating solution in this order to carry out surface treatment of the copper foils, followed by drying with heating. Thereafter, without patterning the copper foils, these inner-layer circuit boards were superposed via adhesive insulating layers under application of heat and pressure to obtain a laminate different from the above multi-layer wiring board. On the laminate thus obtained, peel strength (bond strength) between the surface-treated copper foil and the adhesive insulating layer was measured to obtain a good result of bond strength 0.91 kg/cm. Thus, the multi-layer wiring boards according to the present Example were ascertained to have a sufficient bond strength between the wiring layer and the adhesive insulating layer.

Next, the above laminate was immersed in a molten solder bath and then drawn up. Thereafter, the bond strength between the wiring layer and the adhesive insulating layer was measured to find that it was 0.91 kg/cm, and it was ascertained that the soldering caused no deterioration of bond strength.

What is claimed is:

1. A process for producing a printed wiring board, comprising the steps of forming a photosensitive resist layer on a copper layer provided on an insulating substrate, patterning the photosensitive resist layer, and etching the copper layer made bare from the photosensitive resist layer to form a copper wiring layer, wherein;

the surface of said copper layer is subjected to pretreatment comprising the steps of black-oxide treating the surface by the use of an alkaline oxidizing solution and subsequently finely surface-roughening the black-oxide treated surface by the use of an acidic treating solution comprised of phosphoric acid or an organic acid, followed by drying in the presence of oxygen, and thereafter said photosensitive resist layer is formed thereon.

2. A process for producing a printed wiring board, comprising the steps of forming a photosensitive resist layer on a copper layer provided on an insulating substrate, patterning the photosensitive resist layer, and etching the copper layer made bare from the photosensitive resist layer to form a copper wiring layer, wherein;

said copper layer comprises a copper foil having been surface-roughened on its one side, and at least the other side unroughened surface of said copper foil is, before said copper foil is laminated to said substrate, subjected to pretreatment comprising the steps of black-oxide treating the surface by the use of an alkaline oxidizing solution and subsequently finely surface-roughening the black-oxide treated surface by the use of an acidic treating solution comprised of phosphoric acid or an organic acid, followed by drying in the presence of oxygen, and thereafter said copper foil is laminated to said insulating substrate in the manner that the former's surface-roughened side comes into contact with the surface of the latter.

3. A process for producing a printed wiring board, comprising the steps of forming a photosensitive resist layer on a copper layer provided on an insulating substrate, patterning the photosensitive resist layer, and etching the copper layer made bare from the photosensitive resist layer to form a copper wiring layer, wherein;

said copper layer comprises a copper foil having not been surface-roughened, and the both surfaces of said copper foil are, before said copper foil is laminated to said substrate, subjected to pretreatment comprising the steps of black-oxide treating the surface by the use of an alkaline oxidizing solution and subsequently finely surface-roughening the black-oxide treated surface by the use of an acidic treating solution comprised of phosphoric acid or an organic acid, followed by drying in the presence of oxygen, and thereafter said copper foil is laminated to said insulating substrate.

4. The process for producing a printed wiring board according to any one of claims 1 to 3, wherein said wiring layer having been subjected to said pretreatment serves as a first wiring layer, on which a photosensitive resin layer is provided and the photosensitive resin layer is patterned to form an insulating layer having a via hole; and a second wiring layer is formed on the insulating layer.

5. The process for producing a printed wiring board according to any one of claims 1 to 3, wherein said drying is carried out under heating.

6. The process for producing a printed wiring board according to claim 4, wherein said drying is carried out under heating.

7. The process for producing a printed wiring board according to any one of claims 1 to 3, wherein said acidic treating solution comprises an aqueous phosphoric acid solution or a buffer solution thereof, having a pH of 0 to 3.

8. The process for producing a printed wiring board according to claim 4, wherein said acidic treating solution comprises an aqueous phosphoric acid solution or a buffer solution thereof, having a pH of 0 to 3.

9. The process for producing a printed wiring board according to any one of claims 1 to 3, wherein said acidic treating solution comprises an aqueous citric acid solution or a buffer solution thereof, having a pH of 0 to 3.

10. The process for producing a printed wiring board according to claim 4, wherein said acidic treating solution comprises an aqueous citric acid solution or a buffer solution thereof, having a pH of 0 to 3.

11. The process for producing a printed wiring board according to claim 2 or 3, wherein said copper foil is, before or after subjected to said pretreatment, provided with a prepreg or a resin layer on its one side coming into contact with said insulating substrate.

* * * * *